INVENTORS
HIROMU OUCHI
MASAMITSU NISHIDA
BY Wenderoth, Lind & Ponack
ATTORNEYS

PIEZOELECTRIC CERAMIC COMPOSITIONS

Filed Jan. 17, 1966 2 Sheets-Sheet 2

INVENTORS
HIROMU OUCHI
MASAMITSU NISHIDA

BY Wenderoth, Lind & Ponack

ATTORNEYS

United States Patent Office 3,403,103
Patented Sept. 24, 1968

3,403,103
PIEZOELECTRIC CERAMIC COMPOSITIONS

Hiromu Ouchi, Toyonaka-shi, Osaka-fu, and Masamitsu Nishida, Osaka-shi, Osaka-fu, Japan, assignors to Matsushita Electric Industrial Co., Ltd., Osaka, Japan Filed Jan. 17, 1966, Ser. No. 520,994
Claims priority, application Japan, Oct. 22, 1965, 40/65,161
4 Claims. (Cl. 252—62.9)

This invention relates to piezoelectric ceramic compositions and articles of manufacture fabricated therefrom. More particularly, the invention pertains to novel ferroelectric ceramics which are polycrystalline aggregates of certain constituents. These piezoelectric compositions are sintered to ceramics by per se conventional ceramic techniques and thereafter the ceramics are polarized by applying a direct current voltage between the electrodes to impart thereto electromechanical transducing properties similar to the well known piezoelectric effect. The invention also encompasses the calcined product of raw ingredients and the articles of manufacture such as electromechanical transducers fabricated from the sintered ceramic.

The ceramic bodies materialized by the present invention exist basically in the following solid solution: the ternary system $Pb(Zn_{1/3}Nb_{2/3})O_3$—$PbTiO_3$—$PbZrO_3$ where niobium atom can be replaced by tantalum.

The use of piezoelectric materials in various transducer applications in the production, measurement and sensing of sound, shock, vibration, pressure, etc., has increased greatly in recent years. Both crystal and ceramic types of transducers have been widely used. But, because of their potentially lower cost and facility in the fabrication of ceramics with various shapes and sizes and their greater durability for high temperature and/or for humidity than that of crystalline substances such as Rochelle salt, piezoelectric ceramic materials have recently become important in various transduced applications.

The piezoelectric characteristics of ceramics required apparently vary with species of applications. For example, electromechanical transducers such as phonograph pick-up and microphone require piezoelectric ceramics characterized by a substantially high electromechanical coupling coefficient and dielectric constant. On the other hand, piezoelectric ceramics for electric wave filters should have a specified value of coupling coefficient. Furthermore, ceramic materials require a high stability with temperature and time in resonant frequency and in other electrical properties.

As more promising ceramics for these requirements, lead titanate-lead zirconate is in wide use. However, it is difficult to sinter the lead titanate-lead zirconate ceramics because of the evaporation of PbO and the dielectric and piezoelectric properties of the lead titanate-lead zirconate ceramics change greatly with change in Zr:Ti ratio.

It is, therefore, the fundamental object of the present invention to provide novel piezoelectric ceramic materials which overcome at least one of the problems outlined above.

A more specific object of the invention is to provide ceramic compositions suitable for use in electromechanical transducers over a wide temperature range.

Another object of the invention is to provide novel polycrystalline ceramic materials characterized by high relative permittivity and piezoelectric response.

A further object of the invention is the provision of piezoelectric ceramic characterized by a high stability in resonant frequency with temperature, suitable for use in electromechanical wave filters.

A still further object of the invention is the provision of novel piezoelectric ceramic compositions, certain properties of which can be adjusted to suit various applications.

These objects of the invention and the manner of their attainment will be clear from the following description and from the accompanying drawings, in which.

Figure 1:
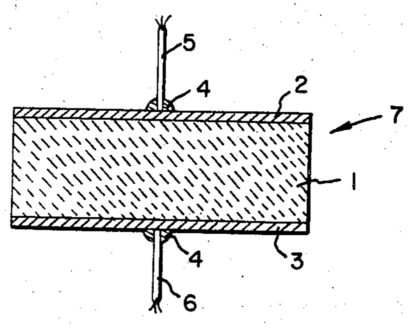
FIG. 1 is a cross-sectional view of an electromechanical transducer embodying the present invention.

Before proceeding with a detailed description of the piezoelectric materials contemplated by the invention, their application in electromechanical transducers will be described with reference to FIG. 1 of the drawings wherein reference character 7 designates, as a whole, an electromechanical transducer having, as its active element, a preferably disc shaped body 1 of piezoelectric ceramic material according to the present invention.

Body 1 is electrostatically polarized, in a manner hereinafter set forth, and is provided with a pair of electrodes 2 and 3, applied in a suitable and per se conventional manner, on two opposed surfaces thereof. Wire leads 5 and 6 are attached conductively to the electrodes 2 and 3 respectively by means of solder 4. When the ceramic is subjected to shock, vibration, or other mechanical stress, electrical output generated can be taken from wire leads 5 and 6. Conversely, as with other piezoelectric transducers, application of electrical voltage to electrodes 5 and 6 will result in mechanical deformation of the ceramic body. It is to be understood that the term electromechanical transducer as used herein is taken in its broadest sense and includes piezoelectric filters, frequency control devices, and the like, and that the invention can also be used and adapted to various other applications requiring materials having dielectric, piezoelectric and/or electrostrictive properties.

According to the present invention, the ceramic body 1, FIG. 1, is formed of novel piezoelectric compositions which are polycrystalline ceramics composed of $$Pb(Zn_{1/3}Nb_{2/3})O_3$$

in solid solution with $PbTiO_3$ and $PbZrO_3$.

Figure 2:
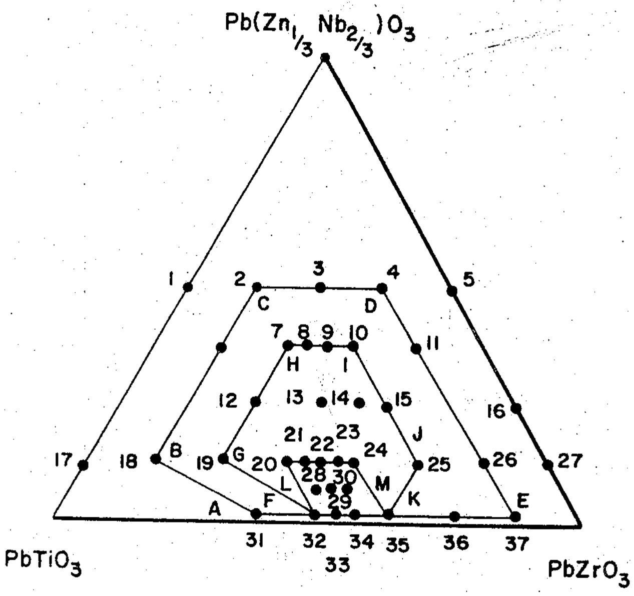
FIG. 2 is a triangular compositional diagram of materials utilized in the present invention.
Figure 3:
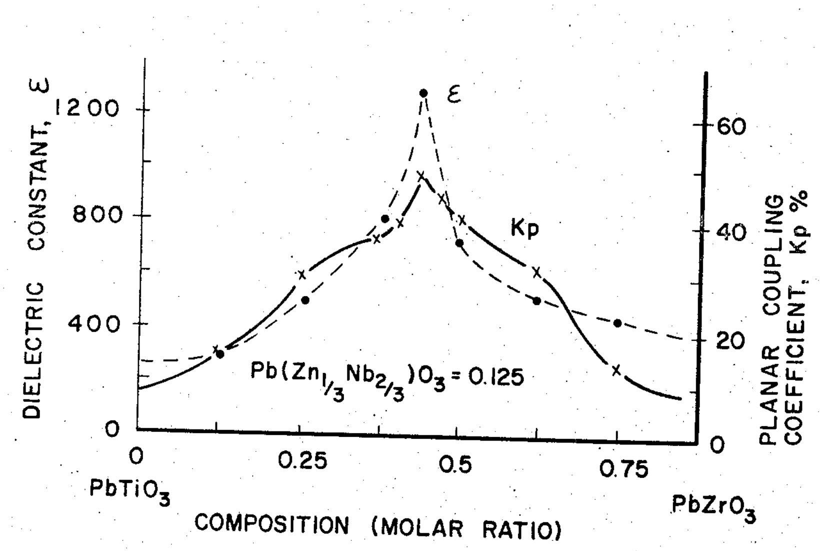
FIG. 3 is a graph showing the effect of compositional change on relative dielectric constant ($\epsilon$) and planar coupling coefficient (Kp.) of exemplary compositions according to the present invention at 20° C. and 1 kc.

All possible compositions coming within the ternary system $Pb(Zn_{1/3}Nb_{2/3})O_3$—$PbTiO_3$—$PbZrO_3$ are represented by the triangular diagram constituting FIG. 2 of the drawings. Some compositions represented by the diagram, however, do not exhibit high piezoelectricity, and many are electromechanically active only to a slight degree. The present invention is concerned only with those compositions exhibiting piezoelectric response of appreciable magnitude. As a matter of convenience, the planar coupling coefficient (Kp.) of test discs will be taken as a measure of piezoelectric activity. Thus, within the area bounded by lines connecting points A, B, C, D, E, FIG. 2, all compositions polarized and tested showed a planar coupling coefficient of at least 10%. Particularly, the compositions in the area of the diagram bounded by lines connecting points F, G, H, I, J, K, FIG. 2, retain a high planar coupling coefficient (Kp.) of 30% or higher, the molar percent of the three components of compositions A, B, C, D, E, F, G, H, I, J, K being as follows:

| | $Pb(Zn_{1/3}Nb_{2/3})O_3$ | $PbTiO_3$ | $PbZrO_3$ |
|---|---|---|---|
| A | 1.0 | 62.5 | 36.5 |
| B | 12.5 | 75.0 | 12.5 |
| C | 50.0 | 37.5 | 12.5 |
| D | 50.0 | 12.5 | 37.5 |
| E | 1.0 | 12.5 | 86.5 |
| F | 1.0 | 50.0 | 49.0 |
| G | 12.5 | 62.5 | 25.0 |
| H | 37.5 | 37.5 | 25.0 |
| I | 37.5 | 25.0 | 37.5 |
| J | 12.5 | 25.0 | 62.5 |
| K | 1.0 | 36.5 | 62.5 |

Furthermore, the compositions near the morphotropic phase boundary, particularly $$Pb(Zn_{1/3}Nb_{2/3})_{0.125}Ti_{0.435}Zr_{0.440}O_3$$

and $Pb(Zn_{1/3}Nb_{2/3})_{0.070}Ti_{0.450}Zr_{0.480}O_3$, give ceramic products having a planar coupling coefficient of 48% or higher.

Figure 4:
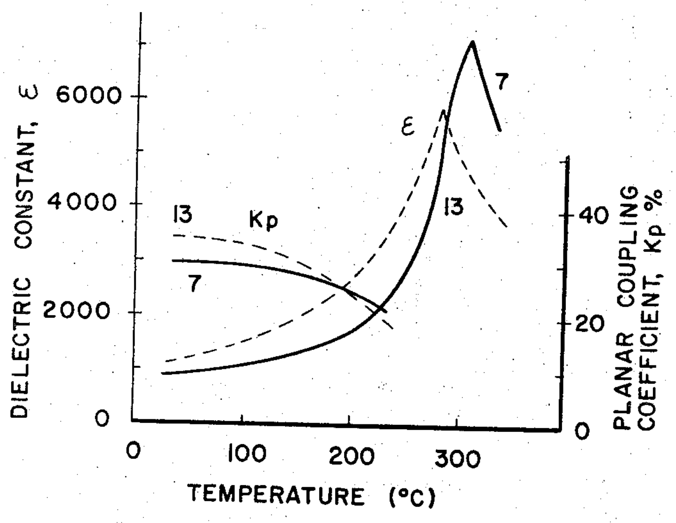
FIG. 4 is a graph showing the temperature dependence of relative dielectric constant ($\epsilon$) and planar coupling coefficient (Kp.) of exemplary compositions according to the present invention.

All the piezoelectric ceramics according to the present invention can be used as electromechanical transducers over a wide temperature range from room temperature (about 20° C.) to about 150° C. FIG. 4 exemplifies this.

The compositions in the area of the diagram bounded by lines connecting points F, L, M, K, FIG. 2, show a high stability in resonant frequency with temperature within the range 20° C. to 75° C., the molar percent of the three components of compositions F, L, M, K being as follows:

| | $Pb(Zn_{1/3}Nb_{2/3})O_3$ | $PbTiO_3$ | $PbZrO_3$ |
|---|---|---|---|
| F | 1.0 | 50.0 | 49.0 |
| L | 12.5 | 50.0 | 37.5 |
| M | 12.5 | 37.5 | 50.0 |
| K | 1.0 | 36.5 | 62.5 |

Changes in the resonant frequency are set forth in the table, infra.

The dielectric and piezoelectric properties of the lead titanate-lead zirconate ceramics change greatly with change in Zr:Ti ratio. According to the present invention, however, the change in piezoelectric response with composition is relatively smaller than that of lead titanate-lead zirconate ceramics.

According to the present invention, dielectric and piezoelectric properties of the ceramics can be adjusted to suit various applications by selecting the proper composition.

The composition described herein may be prepared in accordance with various per se well known ceramic procedures. A preferred method, however, hereinafter more fully described, consists in the use of lead oxide (PbO), zinc oxide (ZnO), niobia ($Nb_2O_5$), and titania ($TiO_2$) and zirconia ($ZrO_2$).

The starting materials, viz., lead oxide (PbO), zinc oxide (ZnO), niobia ($Nb_2O_5$), and titania ($TiO_2$) and zirconia ($ZrO_2$), all of relatively pure grade (e.g., C.P. grade), are intimately mixed in a rubber-lined ball mill with distilled water. In milling the mixture care should be exercised to avoid, or the proportions of ingredients varied to compensate for, contamination by wear of the milling ball or stones.

Following the wet milling, the mixture is dried and mixed to assure as homogeneous a mixture as possible. Thereafter, the mixture, suitably formed into desired shapes, is prereacted by sintering at a temperature of around 850° C. for 2 hours.

After the presintering, the reacted materials are allowed to cool and are then wet milled to a small particle size. Once again, care should be exercised to avoid, or the proportions of ingredients varied to compensate for, contamination by wear of the milling balls or stones. Depending on preference and the shapes desired, the material can be formed into a mix or slip suitable for pressing, slip casting, or extruding, as the case may be, in accordance with per se conventional ceramic procedures. A typical sample for which data are given hereinbelow is prepared by mixing 100 grams of milled presintered mixture with 5 milliliters of water. The mix is then pressed into discs of 10 millimeters diameter and 1 millimeter thickness at a pressure of 700 kilograms per square centimeter. The pressed discs are fired at temperatures indicated in the table for 45 minutes of heating period.

According to the present invention, there is no need to fire the compositions in an atmosphere of PbO and no special care is required for the temperature gradient in a furnace. Thus, according to the invention, uniform and excellent piezoelectric ceramics can be easily obtained simply by covering the samples with an alumina crucible.

The sintered ceramics are polished on both surfaces to the thickness of 0.5 millimeter. The disc surfaces may then be coated with silver paint and fired to form silver electrodes. Finally, the discs are polarized while immersed in a bath of silicone oil at 100° C. A voltage gradient of 4 kv. per mm. (direct current) is maintained for 30 minutes, and the discs are field-cooled to room temperature in 30 minutes.

The dielectric and piezoelectric properties of the polarized specimen, measured at 20° C. in a relative humidity of 50% and at a frequency of 1 kc., are listed in the table.

In addition to the superior properties shown above, compositions according to the present invention yield ceramics which are of good physical quality and which polarize well. It will be understood from the foregoing that the ternary solid solution $$Pb(Zn_{1/3}Nb_{2/3})O_3—PbTiO_3—PbZrO_3$$

forms an excellent piezoelectric ceramic body.

While there have been described presently preferred embodiments of this invention, various changes and modifications can be made therein without departing from the invention, and it is aimed, therefore, to cover in the appended claims all such changes and modifications as fall with the true spirit and scope of the invention.

TABLE

| Example No. | Mole percent of composition | | | Firing Temp. ° C. | 24 hours after poling | | | | Temperature change in resonant frequency, in percent [1] |
|---|---|---|---|---|---|---|---|---|---|
| | $Pb(Zn_{1/3}Nb_{2/3})O_3$ | $PbTiO_3$ | $PbZrO_3$ | | Dielectric constant ε at 1 kc. P.S. | Dissipation D, in percent at 1 kc. P.S. | Planar coupling coeff. kp., in percent | Resonant resistance R, Ω | |
| 1 | 50.0 | 50.0 | 0.0 | 1,180 | 419 | 1.31 | 6.1 | 921.0 | (2) |
| 2 | 50.0 | 37.5 | 12.5 | 1,180 | 483 | 2.20 | 9.9 | 412.5 | ---------- |
| 3 | 50.0 | 25.0 | 25.0 | 1,200 | 1,279 | 4.43 | 9.4 | 247.0 | ---------- |
| 4 | 50.0 | 12.5 | 37.5 | 1,200 | 513 | 3.51 | 10.1 | 332.0 | ---------- |
| 5 | 50.0 | 0.0 | 50.0 | 1,200 | 364 | 2.60 | 5.7 | 1,054.0 | ---------- |
| 6 | 37.5 | 50.0 | 12.5 | 1,220 | 537 | 1.27 | 15.0 | 175.0 | ---------- |
| 7 | 37.5 | 37.5 | 25.0 | 1,240 | 940 | 1.11 | 31.1 | 65.0 | ---------- |
| 8 | 37.5 | 34.5 | 28.0 | 1,200 | 1,348 | 1.28 | 38.3 | 31.7 | ---------- |
| 9 | 37.5 | 31.5 | 31.0 | 1,220 | 1,130 | 1.82 | 33.2 | 40.4 | ---------- |
| 10 | 37.5 | 25.0 | 37.5 | 1,220 | 725 | 2.11 | 30.5 | 48.5 | ---------- |
| 11 | 37.5 | 12.5 | 50.0 | 1,220 | 366 | 2.60 | 9.7 | 321.0 | ---------- |
| 12 | 25.0 | 50.0 | 25.0 | 1,200 | 708 | 1.08 | 19.4 | 111.0 | −0.585 |
| 13 | 25.0 | 37.5 | 37.5 | 1,220 | 1,047 | 1.98 | 36.7 | 37.7 | ---------- |
| 14 | 25.0 | 31.5 | 43.5 | 1,200 | 861 | 3.00 | 38.7 | 47.1 | ---------- |
| 15 | 25.0 | 25.0 | 50.0 | 1,220 | 621 | 3.08 | 27.0 | 69.6 | ---------- |
| 16 | 25.0 | 0.0 | 75.0 | 1,180 | 430 | 2.80 | 8.4 | 463.5 | ---------- |
| 17 | 12.5 | 87.5 | 0.0 | 1,200 | 260 | 1.92 | 7.5 | ---------- | ---------- |
| 18 | 12.5 | 75.0 | 12.5 | 1,200 | 303 | 1.47 | 15.1 | ---------- | ---------- |

TABLE—Continued

| Example No. | Mole percent of composition | | | Firing Temp. ° C. | 24 hours after poling | | | | Temperature change in resonant frequency, in percent [1] |
|---|---|---|---|---|---|---|---|---|---|
| | $Pb(Zn_{1/3}Nb_{2/3})O_3$ | $PbTiO_3$ | $PbZrO_3$ | | Dielectric constant ε at 1 kc. P.S. | Dissipation D, in percent at 1 kc. P.S. | Planar coupling coeff. kp., in percent | Resonant resistance R, Ω | |
| 19 | 12.5 | 62.5 | 25.0 | 1,210 | 500 | 1.10 | 29.5 | 76.0 | −0.772 |
| 20 | 12.5 | 50.0 | 37.5 | 1,210 | 807 | 1.09 | 37.0 | 38.0 | −0.501 |
| 21 | 12.5 | 46.5 | 41.0 | 1,210 | 998 | 1.11 | 39.9 | 29.7 | ---------- |
| 22 | 12.5 | 43.5 | 44.0 | 1,240 | 1,290 | 1.32 | 48.1 | 20.8 | −0.293 |
| 23 | 12.5 | 40.5 | 47.0 | 1,240 | 1,041 | 1.87 | 44.1 | 30.0 | ---------- |
| 24 | 12.5 | 37.5 | 50.0 | 1,210 | 730 | 2.52 | 41.4 | 40.4 | −0.303 |
| 25 | 12.5 | 25.0 | 62.5 | 1,210 | 522 | 2.93 | 31.7 | 45.0 | −0.419 |
| 26 | 12.5 | 12.5 | 75.0 | 1,220 | 454 | 2.78 | 13.5 | 262.0 | ---------- |
| 27 | 12.5 | 0.0 | 87.5 | 1,220 | 359 | 1.49 | 6.8 | ---------- | ---------- |
| 28 | 7.0 | 48.0 | 45.0 | 1,220 | 892 | 1.22 | 38.7 | 36.7 | ---------- |
| 29 | 7.0 | 45.0 | 48.0 | 1,220 | 1,178 | 1.24 | 48.6 | 25.3 | −0.260 |
| 30 | 7.0 | 42.0 | 51.0 | 1,220 | 927 | 1.83 | 39.3 | 40.0 | ---------- |
| 31 | 1.0 | 62.5 | 36.5 | 1,180 | 272 | 2.15 | 12.2 | 415.0 | ---------- |
| 32 | 1.0 | 50.0 | 49.0 | 1,180 | 627 | 1.11 | 32.2 | 67.4 | −0.333 |
| 33 | 1.0 | 47.0 | 52.0 | 1,180 | 756 | 1.16 | 34.8 | 51.3 | 0.078 |
| 34 | 1.0 | 44.0 | 55.0 | 1,180 | 809 | 1.21 | 38.0 | 42.6 | 0.391 |
| 35 | 1.0 | 36.5 | 62.5 | 1,200 | 417 | 2.60 | 32.9 | 100.5 | −0.672 |
| 36 | 1.0 | 24.0 | 75.0 | 1,190 | 279 | 2.68 | 20.5 | 193.0 | ---------- |
| 37 | 1.0 | 12.5 | 86.5 | 1,190 | 250 | 3.12 | 14.5 | 412.0 | ---------- |

[1] $\frac{fr(75° C.) - fr(20° C.)}{fr(20° C.)} \times 100\%$; fr(75° C.) and fr(20° C.) are resonant frequency at 75° C. and 20° C., respectively.
[2] Not determined.

We claim:

1. As a novel ferroelectric ceramic composition of matter, a solid solution consisting essentially of a material selected from the area bounded by lines connecting points A, B, C, D, E, in FIG. 2, wherein A, B, C, D, E have the following formulae A $Pb(Zn_{1/3}Nb_{2/3})_{0.010}Ti_{0.625}Zr_{0.365}O_3$
B $Pb(Zn_{1/3}Nb_{2/3})_{0.125}Ti_{0.750}Zr_{0.125}O_3$
C $Pb(Zn_{1/3}Nb_{2/3})_{0.500}Ti_{0.375}Zr_{0.125}O_3$
D $Pb(Zn_{1/3}Nb_{2/3})_{0.500}Ti_{0.125}Zr_{0.375}O_3$
E $Pb(Zn_{1/3}Nb_{2/3})_{0.010}Ti_{0.125}Zr_{0.865}O_3$ 2. As a novel piezoelectric ceramic composition of matter, a solid solution consisting essentially of a material selected from the area bounded by lines connecting points F, G, H, I, J, K of the diagram of FIG. 2, wherein F, G, H, I, J have the following formulae F $Pb(Zn_{1/3}Nb_{2/3})_{0.010}Ti_{0.500}Zr_{0.490}O_3$
G $Pb(Zn_{1/3}Nb_{2/3})_{0.125}Ti_{0.625}Zr_{0.250}O_3$
H $Pb(Zn_{1/3}Nb_{2/3})_{0.375}Ti_{0.375}Zr_{0.250}O_3$
I $Pb(Zn_{1/3}Nb_{2/3})_{0.375}Ti_{0.250}Zr_{0.375}O_3$
J $Pb(Zn_{1/3}Nb_{2/3})_{0.125}Ti_{0.250}Zr_{0.625}O_3$
K $Pb(Zn_{1/3}Nb_{2/3})_{0.010}Ti_{0.365}Zr_{0.625}O_3$ 3. An electromechanical transducer element composed of an electrostatically polarized solid solution ceramic consisting essentially of a material selected from the area bounded by lines connecting points F, L, M, K, FIG. 2, wherein F, L, M, K have the following formulae F $Pb(Zn_{1/3}Nb_{2/3})_{0.010}Ti_{0.500}Zr_{0.490}O_3$
L $Pb(Zn_{1/3}Nb_{2/3})_{0.125}Ti_{0.500}Zr_{0.375}O_3$
M $Pb(Zn_{1/3}Nb_{2/3})_{0.125}Ti_{0.375}Zr_{0.500}O_3$
K $Pb(Zn_{1/3}Nb_{2/3})_{0.010}Ti_{0.365}Zr_{0.625}O_3$ 4. As novel composition of matter, a piezoelectric ceramic material consisting essentially of a solid solution having one of the following formulae $Pb(Zn_{1/3}Nb_{2/3})_{0.125}Ti_{0.435}Zr_{0.440}O_3$ and $Pb(Zn_{1/3}Nb_{2/3})_{0.070}Ti_{0.450}Zr_{0.480}O_3$

References Cited

UNITED STATES PATENTS 3,268,453 8/1966 Ouchi et al. ______ 252—62.9

TOBIAS E. LEVOW, *Primary Examiner.*

ROBERT D. EDMONDS, *Assistant Examiner.*